United States Patent [19]

Alcone

[11] Patent Number: 5,157,596
[45] Date of Patent: Oct. 20, 1992

[54] ADAPTIVE NOISE CANCELLATION IN A CLOSED LOOP CONTROL SYSTEM

[75] Inventor: Jerry M. Alcone, Albuquerque, N. Mex.

[73] Assignee: Hughes Aircraft Company, Los Angeles, Calif.

[21] Appl. No.: 75,013

[22] Filed: Jul. 17, 1987

[51] Int. Cl.$^5$ .......................... G05B 13/00; H03F 1/26
[52] U.S. Cl. .................................... 364/148; 364/572; 364/574; 364/152
[58] Field of Search ............... 364/572, 574, 148, 724, 364/152; 375/724, 103; 318/624; 333/165, 166, 28 R; 381/94, 92; 358/167; 455/50, 63

[56] References Cited

U.S. PATENT DOCUMENTS

| | | | |
|---|---|---|---|
| 3,932,818 | 1/1976 | Masak | 375/103 |
| 3,961,234 | 6/1976 | Chambers et al. | 318/624 |
| 4,238,746 | 12/1980 | McCool et al. | 333/165 |
| 4,524,424 | 6/1985 | White | 364/724 |
| 4,589,137 | 5/1986 | Miller | 381/94 |
| 4,658,426 | 4/1987 | Chabries et al. | 381/94 |
| 4,730,343 | 3/1988 | Kanemasa et al. | 375/103 |

OTHER PUBLICATIONS

B. Widrow et al., "Adaptive Noise Cancelling: Principles and Applications", Proceedings of the IEEE, vol. 63, No. 12, pp. 1692-1716, Dec. 1975.
S. Narayan et al., "Transform Domain LMS Algorithm," IEEE Trans. ASSP, vol. ASSP-31, No. 3, pp. 609-615, Jun. 1983.

Primary Examiner—Sal Cangialosi
Attorney, Agent, or Firm—Georgann S. Grunebach; William J. Streeter; Wanda K. Denson-Low

[57] ABSTRACT

An adaptive noise cancellation system reduces undesired noise in a closed loop control system by injecting an adaptively constructed noise cancellation signal at an appropriate point in the closed control loop. The generation of a compensation filter N for adaptive noise cancellation loop error signal is disclosed by two methods. A first method is an inverse error rejection response (IERR) method. A second method optimally matches spectrums of a noise signal and a noise reference signal at the adaptive noise cancellation system. This second method is referred to as a spectral matching (SM) method.

19 Claims, 10 Drawing Sheets

FIG. 6  ERROR REJECTION OF CONTROL LOOP

PHASE AND GAIN CURVES FOR ANC COMPENSATION

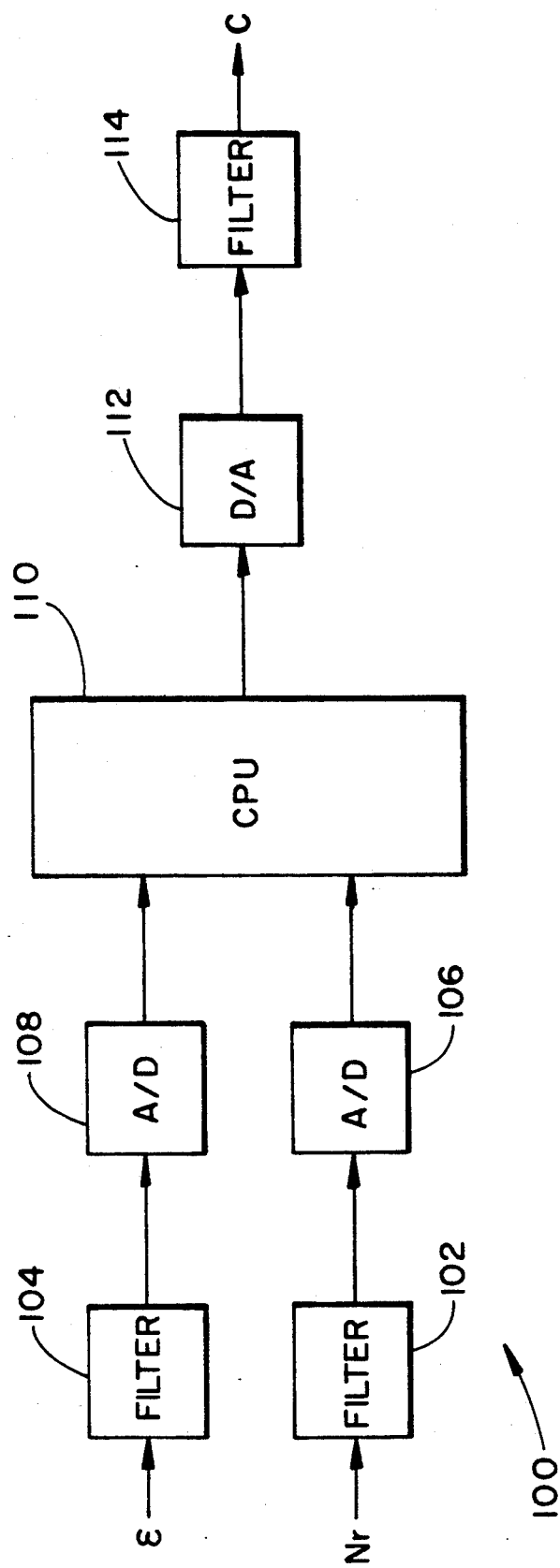

ADAPTIVE NOISE CANCELLATION IN A CLOSED LOOP CONTROL SYSTEM

FIELD OF THE INVENTION

This invention relates to apparatus and methods for reducing undesired noise in a control system output signal and, in particular, relates to apparatus and methods for reducing this noise in a closed loop control system with an adaptively constructed cancellation signal which is based on a correlated measure of the undesired noise, the cancellation signal being injected at an appropriate point in the control loop.

BACKGROUND OF THE INVENTION

Methods and apparatus which reduce undesired noise on a control system output in a closed loop system have typically utilized some type of a noise reduction means, such as an inline filter, within the control loop itself. One disadvantage of inline filtering is that some portion of a desired control signal is typically also reduced by the action of the filter. Another disadvantage of this technique is that the filtering characteristics of the filter are normally fixed and, therefore, the filter does not respond to changes in the system which change the noise rejection characteristics of the system. Similarly, the filter does not respond to changes in the characteristics of the noise itself, resulting in more of the noise being passed through to the output of the control system.

A still further disadvantage of the systems of the prior art is that if it is desired to change the characteristics of the noise reduction means such a change may not be easily or readily accomplished inasmuch as the noise reduction means is physically placed within the control loop itself. Thus, retrofit of existing systems with a noise reduction means is either impossible or extremely difficult to achieve without inducing adverse effects on system stability and bandwidth.

A noise reduction means which has been known in the prior art is an Adaptive Noise Cancellation (ANC) system which has been employed solely in open loop types of systems. One application of ANC in the prior art has been the elimination of noise in data on transmission lines. In general, ANC involves generating an estimate of the noise and thereafter subtracting this estimate from the noise and signal on the transmission line. Thus, the degradation of the signal is substantially avoided since only the noise component is being subtracted, as opposed to inline filtering wherein both the signal and the noise are acted upon by the filter.

As can be appreciated, such a technique is more readily accomplished in an open-loop environment wherein there is, by definition, no feedback of signal and noise through the loop.

As can be further appreciated, there are a great number and variety of closed-loop control systems which would benefit from such an adaptive noise cancellation system. Examples of such systems are cross coupled loops such as inertially stabilized pointing systems, optical systems wherein the motion of a moveable optical element such as a rotating beamsplitter or a steering mirror must be precisely controlled and, also, vibration suppression systems such as those employed in large structures such as orbiting structures.

It is therefore an object of the present invention to provide for reducing undesired noise in a closed loop control system by means of an adaptive noise cancellation system.

It is also an object of the present invention to provide an adaptive noise cancellation system which measures both internal and external disturbances to the system in order to provide a disturbance cancellation output.

It is a still further object of the present invention to provide an adaptive noise cancellation system which is well suited for retrofitting an existing system or for incorporation into a new system.

SUMMARY OF THE INVENTION

The foregoing problems are overcome and other advantages are realized by a closed loop adaptive noise cancellation system, in accordance with the apparatus and methods of the invention, that reduces undesired noise on a control system output by injecting an adaptively constructed cancellation signal at an appropriate point in the closed control loop.

A typical embodiment of an ANC system is comprised of a tapped delay line means operable for generating a plurality of time delayed versions of a noise reference signal, Nr. These delayed versions of Nr are each multiplied by the loop error signal and integrated to produce a weighting gradient function, W. The W signals are thereafter multiplied by their respective delayed Nr signals and are subsequently summed to provide the noise cancellation signal C. It is further shown that the compensation N of the loop error signal $\epsilon$ results in desired phase and gain curves and the stability of both the closed loop system and the ANC.

It is further shown that the ANC system may be coupled to the closed loop system in a variety of different ways, the compensation N providing for accommodation of the various dynamics which may appear between a noise signal, Np, input and the injection of the noise cancellation signal C.

The derivation of the compensation N for the ANC system loop error signal $\epsilon$ is disclosed by two methods. A first method is an Inverse Error Rejection Response (IERR) method. A second method optimally matches spectrums of a noise signal and a noise reference signal at the ANC system. This second method is referred to as a Spectral Matching (SM) method.

BRIEF DESCRIPTION OF THE DRAWINGS

These and other aspects of the invention will be fully described in the following Detailed Description of the Invention taken in conjunction with the drawings wherein:

FIG. 13 is a block diagram of a digital system operable for the generation of the signal C.

DETAILED DESCRIPTION OF THE INVENTION

In order to facilitate the description of the closed loop adaptive noise cancellation (ANC) system of the invention, a brief description will first be given of a typical open loop ANC system of the prior art.

Figure 1:
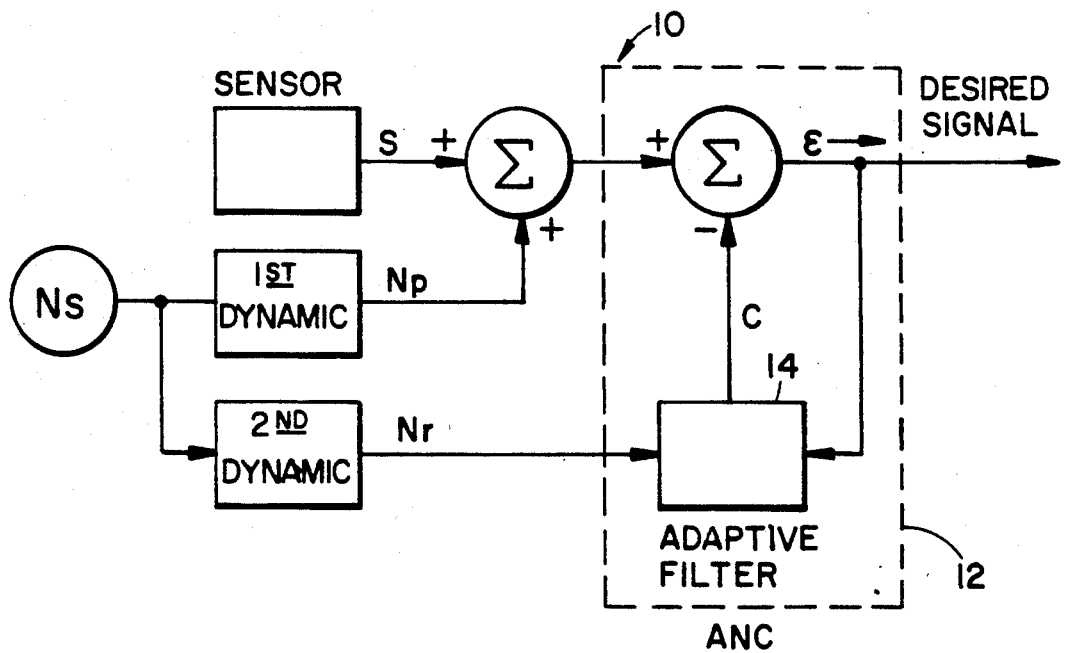
FIG. 1 is a block diagram of a typical open loop system having an ANC system coupled thereto.

A typical open loop ANC system 10 block diagram is shown in FIG. 1. The ANC 12 itself operates as a closed loop with feedback. However, a desired signal (S) plus an undesirable noise (Np) component propagate through the system 10 in a serial, open loop manner.

The various signals shown in FIG. 1 are defined as follows:

S = Signal,
Ns = Noise source,
Np = Noise imposed on S by Ns,
Nr = Measurement of Ns,
C = Cancellation signal estimate, and
$\epsilon$ = Error signal.

Two basic assumptions are made in the analysis of such a system. One is that the Nr signal is correlated to the Np signal to some undetermined degree and, secondly, that S is uncorrelated with Ns and hence Nr and Np.

The error, $\epsilon$, is related to the signal, the noise and the cancellation signals as shown in Equation 1.

$$\epsilon = S + (Np - C) \tag{1}$$

In order to transform the error into units of power the equation for $\epsilon$ is squared on both sides as shown below in Equation 2. The reason for transforming the error into units of power will become apparent hereinafter.

$$\epsilon^2 = S^2 + (Np - C)^2 + 2S(Np - C) \tag{2}$$

If the assumption that S is uncorrelated with Np and Nr is applied, (C will be shown to be constructed of a weighted sum of Nr and various delayed versions of Nr) then Equation 2 can be reduced to Equation 3 by taking its expectation, E, as follows $$E[\epsilon^2] = E[S^2] + E[(Np - C)^2]. \tag{3}$$

If an adaptive filter is structured to minimize the power in $\epsilon$, or E ($\epsilon^2$) with respect to Np through the estimate of C, then the (Np−C)$^2$ portion of the equation will be minimized and S$^2$ will be unaffected. Furthermore, it can be seen that ($\epsilon^2$ − S$^2$) will also be minimized. This is the least square of the power when $\epsilon$ approaches S, and C approaches Np.

In general, it can be realized that minimizing the total output power of the ANC 12 minimizes the output noise power and, since the signal power remains constant, this maximizes the signal-to-noise ratio (S/Np) of the output of the ANC 12. An adaptive filter 14 which implements the least square algorithm formulated above will now be described in reference to a simple, single degree of freedom adaptive filter of the form shown in Equation 4:

$$C = WNr, \text{ where W is a scalar weight.} \tag{4}$$

The equation for the error $\epsilon$, defined in Equation 1) can be rewritten as shown in Equation 5.

$$\epsilon = S + Np - WNr \tag{5}$$

Following the same procedure as used before, the error is transformed to units of power as defined by Equation 6.

$$\epsilon^2 = (S + Np)^2 - 2(S + Np)WNr + (WNr)^2 \tag{6}$$

The change in the error power, $\epsilon^2$, with respect to the weight, W, (the error power gradient) is calculated by taking the derivative of Equation 6 with respect to W as shown in Equation 7.

$$\frac{d(\epsilon^2)}{dW} = -2(S + Np)Nr + 2WNr^2 \tag{7}$$

The error power gradient is known to be a good approximation to the negative of the weight gradient, the weight gradient being the change in the weight, W, with respect to time, t. This approximation is given below in Equation 8

$$\frac{dW}{dt} \doteq \frac{\mu d(\epsilon^2)}{dW} = -2\mu Nr[WNr - (S + Np)] \tag{8}$$

where $\mu$ is an arbitrary constant of proportionality.

Equation 8 can be simplified to the form shown in Equation 9 by recalling that C=WNr and that $\epsilon$ = S + Np − C.

$$\frac{dW}{dt} = 2\mu Nr\epsilon \tag{9}$$

The weight estimate can now be calculated by integrating Equation 9 over time as shown in Equation 10.

$$W = \int_o^t 2\mu Nr\epsilon dt \tag{10}$$

The Laplace Transform of Equation 10 is shown in Equation 11 where s is the Laplace variable.

$$W = \frac{2\mu Nr\epsilon}{S} \quad (11)$$

The weight is then multiplied by the Nr signal to produce the cancellation signal, C, which minimizes the error with respect to Nr.

The derivation presented above has been one dimensional with regard to the weight function. A vector implementation of the aforementioned algorithm merges the least square algorithm with a processor which calculates the approximation to the correlation between the noise reference measurement and the primary noise as presented above. The processor typically comprises a Tapped Delay Line (TDL) means. The TDL means generates a noise reference vector consisting of elements that are progressively time delayed versions of the noise reference measurement. Weighted versions of these time delayed elements are utilized to construct the estimate of Np.

Figure 2:
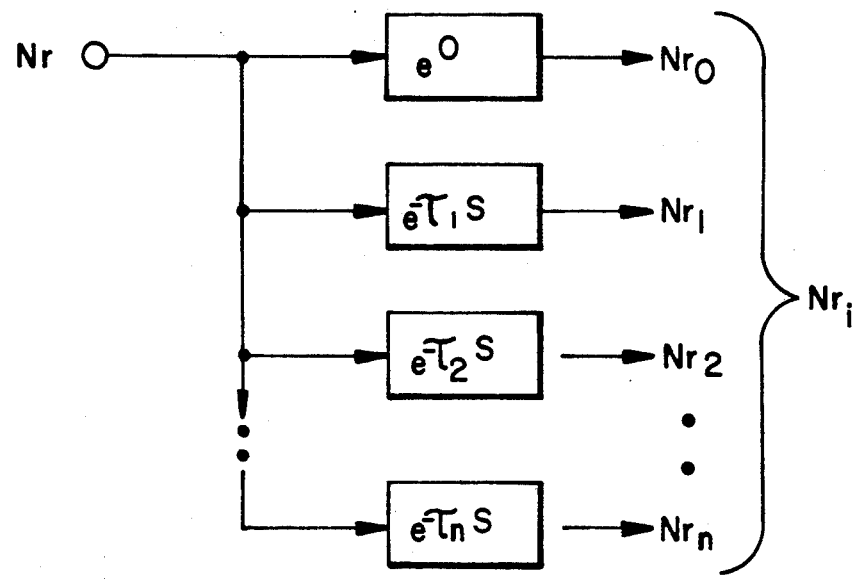
FIG. 2 is a block diagram of a tapped delay line means which is one feature of the invention.

The block diagram of FIG. 2 illustrates such a TDL processor. The noise reference vector, ($Nr_i$) is an n dimensional representation of the noise measurement, Nr. The constituent elements of Nri range from an undelayed version of the noise measurement spectrum ($Nr_o$) to the longest delayed spectrum designated by $Nr_n$. Each filter path (either undelayed or delayed) is normally referred to as a tap. The cancellation signal constructed by the above method is represented by Equation 12.

$$C = \sum_{i=o}^{i=n} W_i N r_i \quad (12)$$

Figure 3:
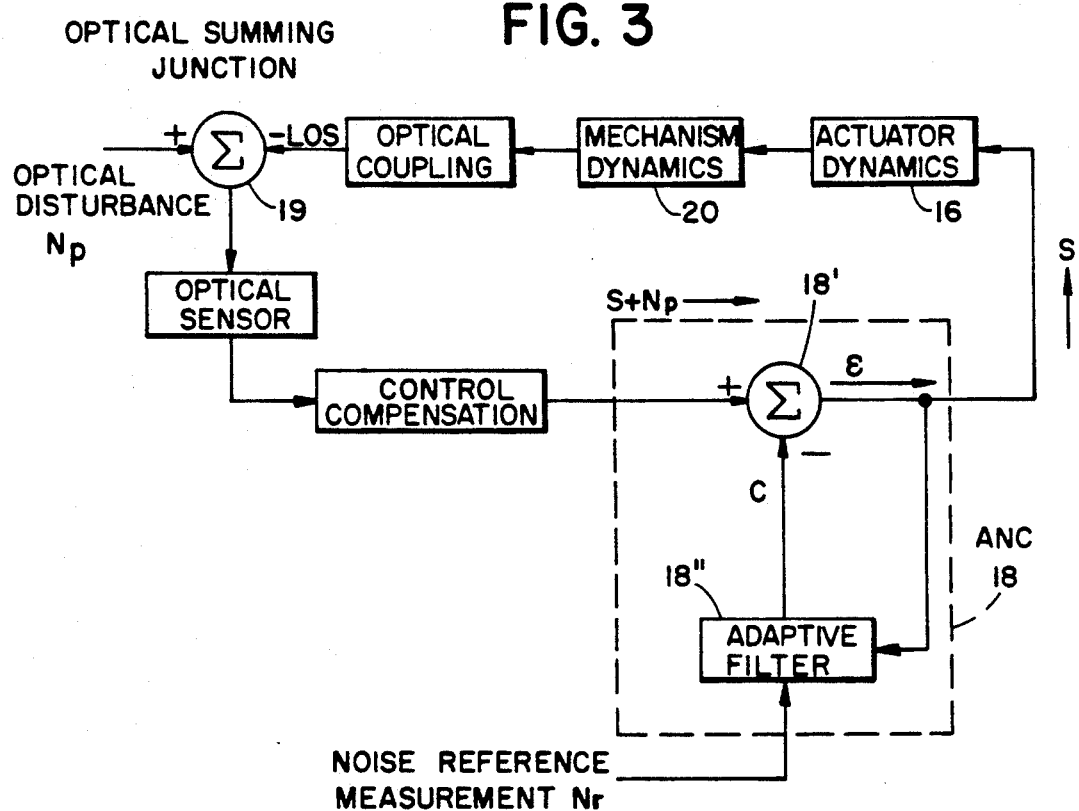
FIG. 3 is a block diagram of a closed loop control system having an ANC system coupled thereto in accordance with one embodiment of the invention in which the ANC acts to reduce the control system's response to a disturbance. This configuration is defined herein as a low power ANC configuration.
Figure 4:
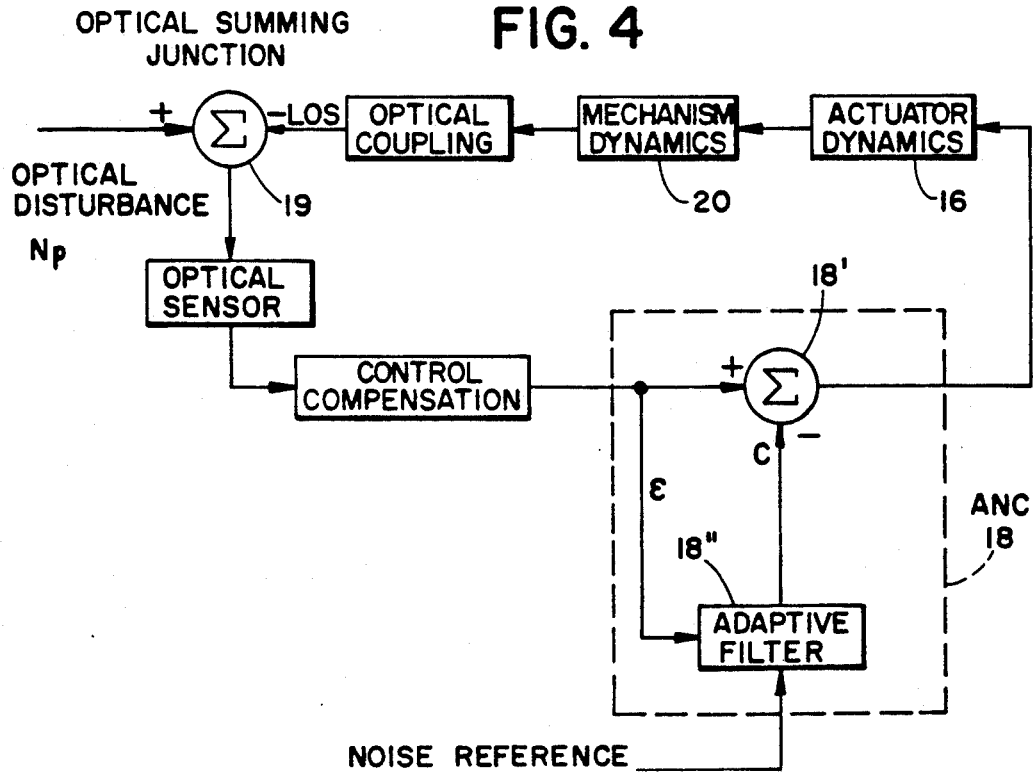
FIG. 4 is a block diagram of a closed loop control system having an ANC system coupled thereto in accordance with another embodiment of the invention in which the ANC acts to increase the control system's rejection of a disturbance. This configuration is defined herein as a high power ANC configuration.

Referring now to FIGS. 3 and 4 there are shown two applications of ANC applied, in accordance with the system and method of the invention, to closed loop control systems. The systems hereinafter described are systems wherein it is desired to control the position of an optical mechanism in a closed loop configuration. It should be realized, however, that the closed loop ANC system and method of the invention is well suited for any type of closed loop system wherein it is desired to minimize a noise signal associated with a system driving command signal.

FIGS. 3 and 4 illustrate two general configurations in which ANC may be applied to a control system. The configuration of FIG. 3 provides noise cancellation for a control loop drive command (S), with respect to the correlated noise between Np and Nr, before the command reaches the control loop actuator 16. In FIG. 3 the control loop is decoupled from Np by the ANC 18. Np is coupled into the closed loop at an optical summing junction 19. The noise cancellation signal C is injected into the control loop at an ANC summing junction 18' and the error signal $\epsilon$ is fed back to ANC 18 from the output side of summing junction 18'.

The configuration of FIG. 4 drives the control loop with a signal that cancels the disturbance of the optical summing junction 19 and, thus, increases the control loop's rejection of the disturbance. The embodiment of FIG. 3 decouples the control loop from the disturbance and, thus, reduces the control loop's response to the disturbance. The embodiment of FIG. 3 is referred to herein as a Low Power Configuration (LPC). The embodiment of FIG. 4 couples the control loop drive to the Np disturbance independent of the bandwidth of the control loop, and is referred to herein as a High Power Configuration (HPC).

Figure 5:
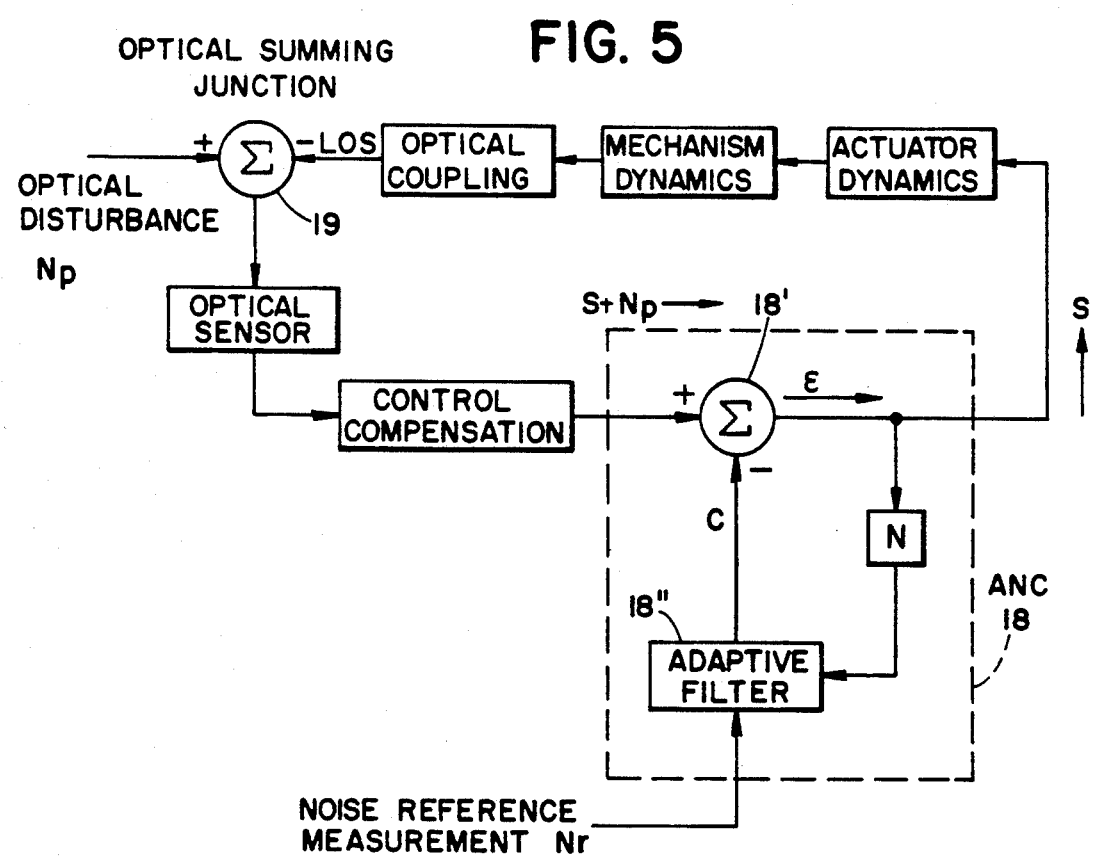
FIG. 5 is a block diagram of the low power ANC system of FIG. 3 showing a compensation block N coupled to the ANC in accordance with the invention.

Some distinctions between the previously described open loop configuration of FIG. 1 and the closed loop configurations of FIGS. 3 and 4 are that the control system, through its feedback path, affects the error signal, $\epsilon$, and, simultaneously, the ANC affects this error by changes in the cancellation signal C. The effect of the ANC on the control system and of the control system on the ANC is corrected for by, in accordance with the invention, compensating the signal $\epsilon$. Such compensation may typically be an electrical compensation of the signal $\epsilon$. One possible compensation location is shown as the block "N" in the block diagram of FIG. 5. In general, there is illustrated in FIG. 5 a relatively simple form of compensation which is utilized herein to describe the basic concepts of the invention. It should be realized however that the compensation block N may be provided at any of the inputs to the adaptive filter block 18″ of FIG. 5, or N may be provided at the output of filter 18″. Similarly, N may be provided simultaneously at all of the inputs and also at the output of filter 18″.

The derivation of the characteristics of the compensation N of FIG. 5 can be achieved by at least two methods. The first method is of a more intuitive nature and is referred to herein as the inverse error rejection response (IERR) method. The second method optimally matches frequency spectrums of the error and noise reference signals at the ANC. This second method is referred to herein as the spectral matching (SM) method. Both methods will now be described by utilizing them to compute N for the low power configuration. The compensation for the high power configuration can be derived in a similar manner.

INVERSE ERROR REJECTION RESPONSE METHOD

In FIG. 5 it can be seen that the ANC 18 is comprised of adaptive filter 18″ in a closed loop system as denoted by the feedback through the block N of the error signal $\epsilon$. The phase or polarity of the feedback signal in a closed loop system must be negative with respect to its output at the system error point for the system to remain stable. The output of adaptive filter 18″ is the cancellation signal, C, and is the input to summing junction 18'. The error signal, $\epsilon$, is the feedback.

The effect of C on $\epsilon$, when the ANC 18 is in parallel with a control system, is characterized by the Bode response of the ratio $\epsilon/C$. This transfer function is the negative of the error rejection response for the control loop and can be written directly in terms of the control loop plant dynamics (represented by G) as shown in Equation 13.

$$\frac{\epsilon}{C} = \frac{-1}{1+G} \quad (13)$$

Figure 6:
FIG. 6 is a graph of error rejection the gain versus frequency of the control ANC system of FIG. 3.

Stability and convergence of the ANC is related to the ability C to reduce $\epsilon$. Without compensation, the ANC error signal, $\epsilon$, is transformed by the control loop as shown in FIG. 6 which illustrates the uncompensated error rejection response for the LPC. The nature of the gain curve shown in FIG. 6 affects the performance of the ANC in its ability to correlate the noise reference and error signals. While not shown in FIG. 6, the phase of the error rejection response transitions from −180 degrees to zero degrees at the resonance frequency for the mechanism dynamics 20, which dynamics may be a beam steering mirror, and then transitions back to $-180$ degrees at the open loop crossover point of the control loop.

Ideally, a transfer function of a constant gain and phase (of 180 degrees) between C and $\epsilon$ would provide optimal stability and performance potential for the ANC system. This ideal situation could be realized for the system characterized in FIG. 6 if compensation equal to the inverse of the error rejection response were introduced as shown in Equation 14.

$$\frac{\epsilon}{C} = N, N = (1 + G) \tag{14}$$

Figure 7:
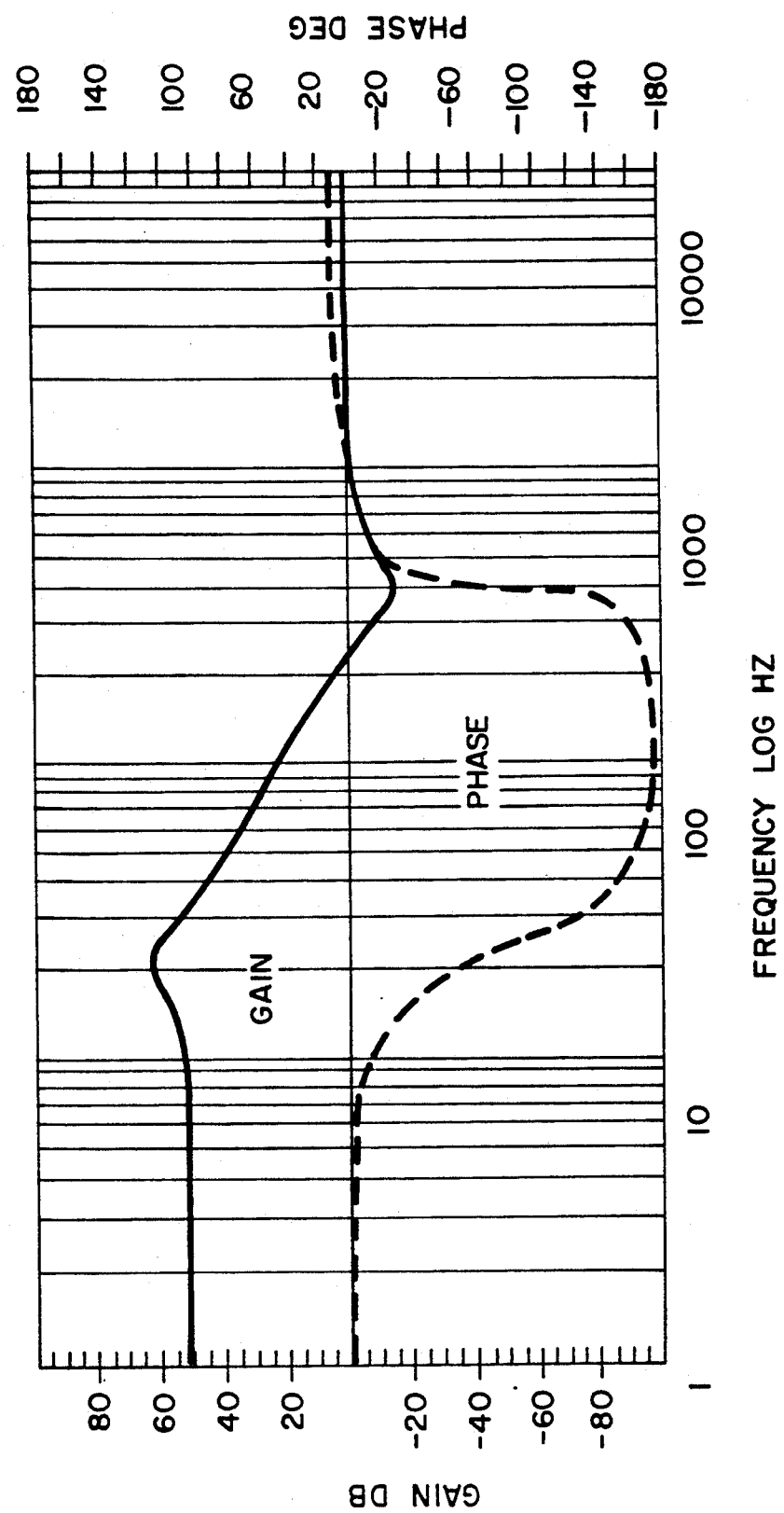
FIG. 7 is a graph of the gain and phase versus frequency of the ANC compensation N for the system of FIG. 5.

Thus, the compensation transfer function for N is substantially the inverse error rejection response of the control loop. The graph of FIG. 7 shows the resultant phase and gain characteristics achieved when the ANC 18 of FIG. 5 is compensated at N by an amount equal to the inverse error rejection response of the control loop.

It should be noted that the characteristics of the compensation N also depend in part on the ANC configuration chosen. The above discussion has showed that the inverse error rejection response is a desired compensation for the LPC. For the HPC, where the error signal is detected on an input side of the summing junction 18' the compensation, N, is the inverse of the closed loop response of the control loop.

In general, it has been found that if the ANC can be electrically connected to the closed loop system the necessary compensation, N, can be generated. The compensation has been found to be the negative inverse of the transfer function of $\epsilon/C$, independent of how the ANC is physically integrated within the control loop.

SPECTRAL MATCHING METHOD

Figure 8:
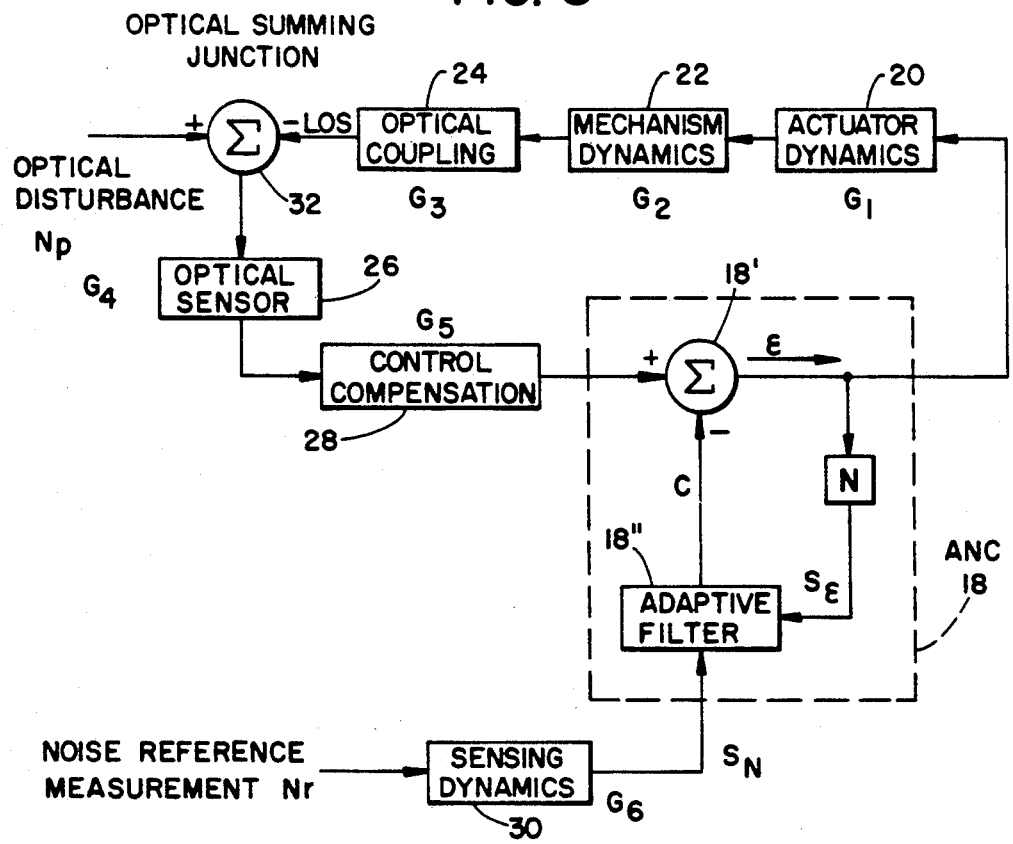
FIG. 8 is a block diagram of the system of FIG. 5 showing the various dynamics which are utilized to perform the spectrum matching method of compensation in accordance with the invention.

The spectral matching method may employ block diagram algebra to solve for the compensation transfer function N. FIG. 8 shows this approach for an optical alignment system with the ANC coupled to the control loop in the lower power configuration. The blocks represent the major elements of an optical alignment control system and the ANC.

A goal of the spectral matching technique is to match the spectrums of the signals $S_\epsilon$ and $S_N$. Thus, the ability of the ANC to correlate the primary noise in the control loop to the noise reference measurement is maximized. The computational approach is in general to derive the spectrum $S_\epsilon$ with respect to Np in terms of the compensation N. Other considerations or assumptions will be explained as they arise during the following derivation.

The control system blocks of FIG. 8 are identified as follows:

$G_1$l32 Actuator Dynamics 20, such as a Power Amplifier;

$G_2$ = Mechanism Dynamics 22, such as a Mirror;

$G_3$ = Optical Coupling Gain 24;

$G_4$ = Optical Sensor 26, such as an Autocollimator Scale Factor;

$G_5$ = Control Loop Compensation 28, such as a Lead/Lag Network; and $G_6$ = Sensing Dynamics 30, which, in general, will result in the Nr measurement being different than the Np disturbance in the control loop.

The summing junction 32 having the Np term input is a summation that occurs optically and, hence, is defined as the optical or sensor space disturbance. The spectral matching approach will be illustrated for this disturbance point in the control loop although the method is equally applicable to other disturbance points and other ANC configurations.

A derivation of the compensation transfer function N is as follows.

$$S_N = Nr_i = NpG_6 \tag{15}$$

Note that although Nri is a vector quantity, generated by the tapped delay line means which comprises a portion of the adaptive filter error processor, it does not affect the computation of N.

The equation of S is shown in Equation 16 in terms of the compensation N.

$$S_\epsilon = N_\epsilon, \epsilon = \frac{S_\epsilon}{N} \tag{16}$$

As has been previously described, the error ($\epsilon$) is equal to (S−C).

Substituting this value for $\epsilon$ into 16 yields Equation 17.

$$S_\epsilon = N(S - C) \tag{17}$$

The $S_C$ response due to $\epsilon$ and Np is calculated in terms of the control block transfer functions as shown in Equation 18.

$$S_C = G_4G_5(Np - \epsilon G_1G_2G_3) \tag{18}$$

Substituting Equation 16 into 18 results in Equation 19

$$S_C = G_4G_5\left(Np - \frac{S_\epsilon G_1G_2G_3}{N}\right). \tag{19}$$

The definition for the cancellation signal, C, is shown in terms of the weighted vector sum of the noise reference signal in Equation 20, vector terms being denoted by a placed over the term.

$$BC = \sum_{i=0}^{i=n} W_i Nr_i = \hat{W}\hat{Nr} \tag{20}$$

Substituting Equation 19 and Equation 20 into equation 17 yields:

$$S_{6S} = N(G_4G_5(Np - S_\epsilon G_1G_2\ G_3) - \hat{W}\hat{Nr}) \tag{21}$$

Collecting like terms in Equation 22 yields $$S_\epsilon(1 + G_1G_2G_3G_4G_5) = Np(G_4G_5N - \hat{W}\hat{Nr}). \tag{22}$$

The following condition is imposed in Equation 23, $$\text{at time } t=0, \hat{W}\hat{Nr}=0. \tag{23}$$

The derivation is herein restricted to t=0 because this is the point in time when ANC convergence or divergence begins. It is the "worst case" point in time for the spectral matching to occur. Equation 24 implements the t=0 condition and equates $S_\epsilon$ to $S_N$.

$$S_\epsilon = \frac{G_4 G_5 N N_p}{(1 + G_1 G_2 G_3 G_4 G_5)} = S_N = N_p G_6 \quad (24)$$

Equation 24 is expressive of the direct implementation of the spectral matching method of the invention.

$$\text{If } \frac{S_\epsilon}{N_p} = \frac{S_N}{N_p} \text{ then, } N = \frac{G_6(1 + G_1 G_2 G_3 G_4 G_5)}{G_4 G_5} \quad (25)$$

or $$N = \frac{(1 + G_1 G_2 G_3 G_4 G_5)}{1} \times \frac{G_6}{G_4} \times \frac{1}{G_5} \quad (26)$$

The transfer function for N shown in Equation 26 is the inverse error rejection response of the control loop times the ratio of the noise reference measurement sensor and the control loop optical sensor times the inverse of the loop compensation. Thus, this method can be seen to provide more information about the form of N than the IERR approach. This additional information can be summarized as follows.

(a) This method takes into account the point in the control loop where Np occurs. The transfer function between the disturbance point and the cancellation point is accounted for by the additional $G_4$ and $G_5$ terms. The IERR method considers only the effects on $\epsilon$ due to C; and (b) The inclusion of the sensing dynamics, $G_6$, by the method provides information on the relative ability of the ANC to detect the disturbance in the control system and in the noise reference measurement.

The inclusion of the inverse compensation term, $1/G_5$, is desirable because Np occurs at an upstream location from the cancellation summing junction 18' and is decorrelated from C by $G_5$. By including its inverse in the compensation transfer function the correlation between the noise in $\epsilon$ and the reference noise measurement is enhanced.

If the ratio of $G_6$ to $G_4$ is equal to one, then the noise reference measurement would be essentially perfect. In practice, this usually will not be possible. In fact, the noise reference and control loop sensing systems are typically closely tied together. If the control loop sensor, that is, optical sensor 26, has a different response than the noise reference sensor 30, Np will be decorrelated by this difference in response. The relative gain difference between the sensors is also expressed in the ratio of $G_6$ to $G_4$.

The sensor dynamics $G_6$ and $G_5$ can be compensated for in the noise reference path by providing an additional compensation block downstream of $G_6$ (not shown). The noise reference measurement may have a known or measurable transfer function from the Np source through the noise measurement device. Also, the control loop sensor may have a known transfer function from the Np source to the ANC error. These transfer functions, if determined and inserted in the noise reference path, will normalize $S_\epsilon$ to $S_N$.

One implication of the above set forth description of the SM method of the invention is that spectral matching can be accomplished by at least two methods. In accordance with one method, the compensation block N contains the necessary transfer functions to match the spectrums $S_\epsilon$ and $S_N$. In accordance with a second method, the reference noise path compensation case, the same spectrums are matched by using compensation in the noise reference path to the ANC.

In general, the relative sensing dynamics and the control loop disturbance input "upstream" dynamics can be compensated for in the error path or in the noise reference path. The choice in compensation locations is whether to match the disturbance spectrums of $S_\epsilon$ and $S_N$ at the disturbance point in the control loop or at the ANC cancellation summing junction point. The choice of which of these two spectral matching methods will yield the best performance is related to the requirements of a specific application. However, the inclusion of the inverse error rejection response component of the N compensation has been shown above to be desirable for ANC stability in closed loop control system applications.

As has been stated, the IERR method insures stability of the ANC when connected to a control loop. It also normalizes the control loop signals to a constant level. The SM method goes further, in that it derives N in such a manner that the compensation is provided for the effect of the control system upon the Np signal before the Np signal arrives at the ANC. This, of course, depends on the point where the Np signal enters the control system. The SM method also identifies the relationship between the control loop sensor and the noise reference sensor and how these two signals are related to ANC compensation.

One important aspect of ANC in a closed loop system which is addressed by the invention is that of configuration selection, that is, the selection of the proper location in the control system to connect the ANC signals. A first determination of the configuration selection relates to a choice of a low power mode or of a high power mode. As discussed above, the low power mode provides for decoupling the control system output from the disturbance source with the ANC. The high power mode provides for enhancing the control system rejection of the sensor space disturbance. Once either of these two modes are selected for a given application, the configuration selection involves, among other factors, minimizing the complexity of implementing the ANC compensation.

Figure 9:
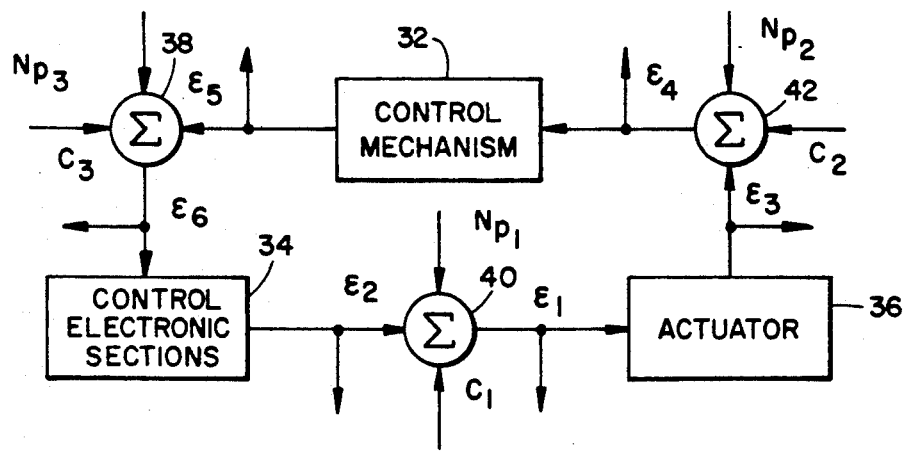
FIG. 9 is a simplified block diagram of a closed loop control system illustrating a plurality of summing junctions for possible connection of an ANC system thereto.

FIG. 9 depicts a general control system block diagram with three generic transfer function blocks (32, 34 and 36) and three possible input summing junctions (38, 40 and 42). There are many different combinations of these blocks in which ANC signals can be connected and disturbance introduced for each low or high power configuration. To restrict the field of possibilities the following general guidelines may be applied:

(1) the connection of the ANC to the control loop should in general be an electrical connection, however, optical or mechanical connections are also within the scope of the invention;

(2) locate the ANC error feedback signal, $\epsilon$, as close as possible to the disturbance point in the loop; and (3) locate the cancellation signal upstream of the point where the disturbance is to be minimized.

The first aforedescribed guideline is obviously a practical consideration when considering the use of ANC in a retrofit application. The flexibility of introducing another actuator or mechanical device into an existing system is normally not available.

The second guideline is related to the foregoing analysis of spectral matching wherein it was shown that the farther away the error feedback signal $\epsilon$ is from the disturbance signal Np the more terms are necessary in the compensation transfer function N. Although it was also shown that this added compensation was only required to enhance the ANC performance.

The third guideline relates to the concept of signal flow in the control loop. Low power cancellation or high power drive commands generated by the ANC are, in general, introduced at a point upstream of the flow of the undesired disturbance effect on the output response of the control loop.

The high power or low power configuration signal selection is related to the second and third guidelines set forth above. For the low power configuration, the error signal is detected downstream of the cancellation signal and as close as possible thereto to minimize dynamics between the two signals. This promotes the cancellation of the disturbance before the disturbance reaches the actuator command.

In the high power configuration the ANC error signal is located past the point where the control loop itself has introduced the correction to the disturbance such that the cancellation signal will command the actuator to drive the controlling mechanism in a manner which minimizes the system error due to the disturbance. In general, the high power configuration drives the controlling mechanism harder than the overall control loop bandwidth might dictate. Thus, the performance improvement of the ANC applied in the high power configuration is directly related to the dynamic range of the controlling mechanism. The error rejection improvement of the disturbance inputs is bounded, typically by the saturation per frequency characteristics of the controlling mechanism.

Figure 10:
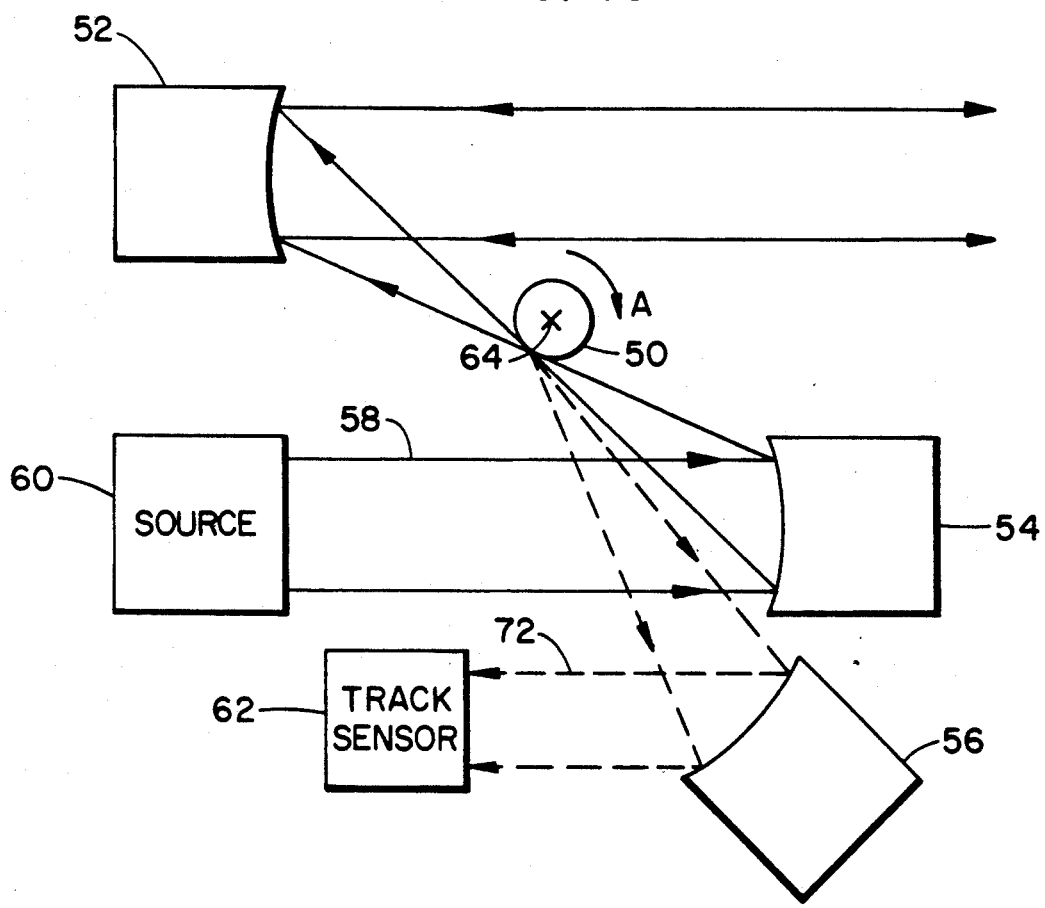
FIGS. 10, 10A and 10B are schematic views of a closed loop optical system.
Figure 10A:
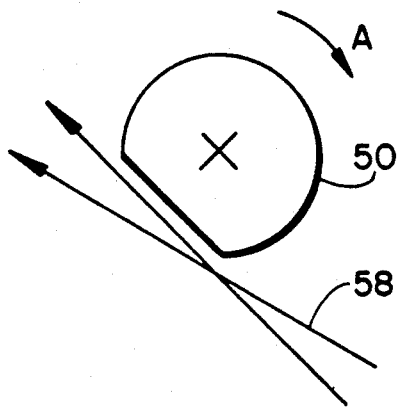
Figure 10B:
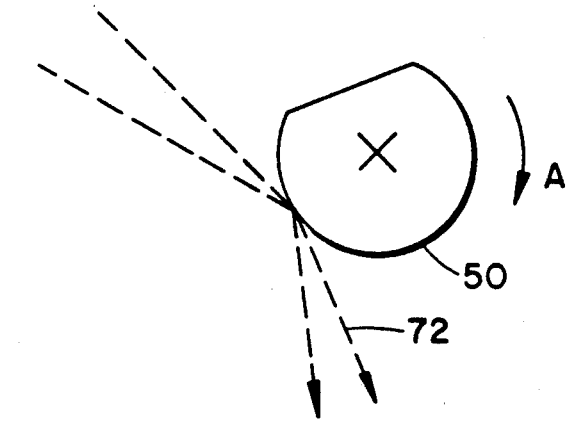

One application of ANC in a closed loop optical system is illustrated in FIG. 10. A rotating beamsplitter 50 is disposed relative to a plurality of mirrors 52, 54 and 56 such that a beam of optical energy 58 emanating from a source 60 may be reflected from the mirror 54 to the mirror 52 and from mirror 52 out of the system If the beam 58 thereafter impinges on a target (not shown) a portion of the beam will be reflected back towards the mirror 52 and by beamsplitter 50 and mirror 56 to a track sensor 62. In order to accomplish these functions the rotating beamsplitter 50 is constructed as a circular cylindrical reflecting element having a flat made along an outer surface thereof Referring to FIG. 10a it can be seen that as the beamsplitter 50 rotates in the direction of the arrow A that the flat is positioned such that the output radiation pulse is permitted to pass by the cylinder to reach the mirror 52. Thus, the output radiation is coupled out of the system. That portion of the radiation which is reflected back from the target arrives at a time subsequent to the time when the output pulse was aligned with the flat. The return pulse 72 impinges, as shown in FIG. 10b, upon a portion of the curved reflective surface of beam splitter 50. Mirror 56 is disposed relative to beamsplitter 50 such that this reflected portion of the return radiation is incident on mirror 56, from whence it is reflected to sensor 62 where it is detected.

As can be appreciated, any motion of the rotating beamsplitter 50, other than a pure rotational motion about a fixed axis 64, appears at the sensor 62 output as an apparent motion of a target. Thus, it is desirable to detect and cancel any motion of beamsplitter 50 other than a pure rotational motion about the axis 64.

Figure 11:
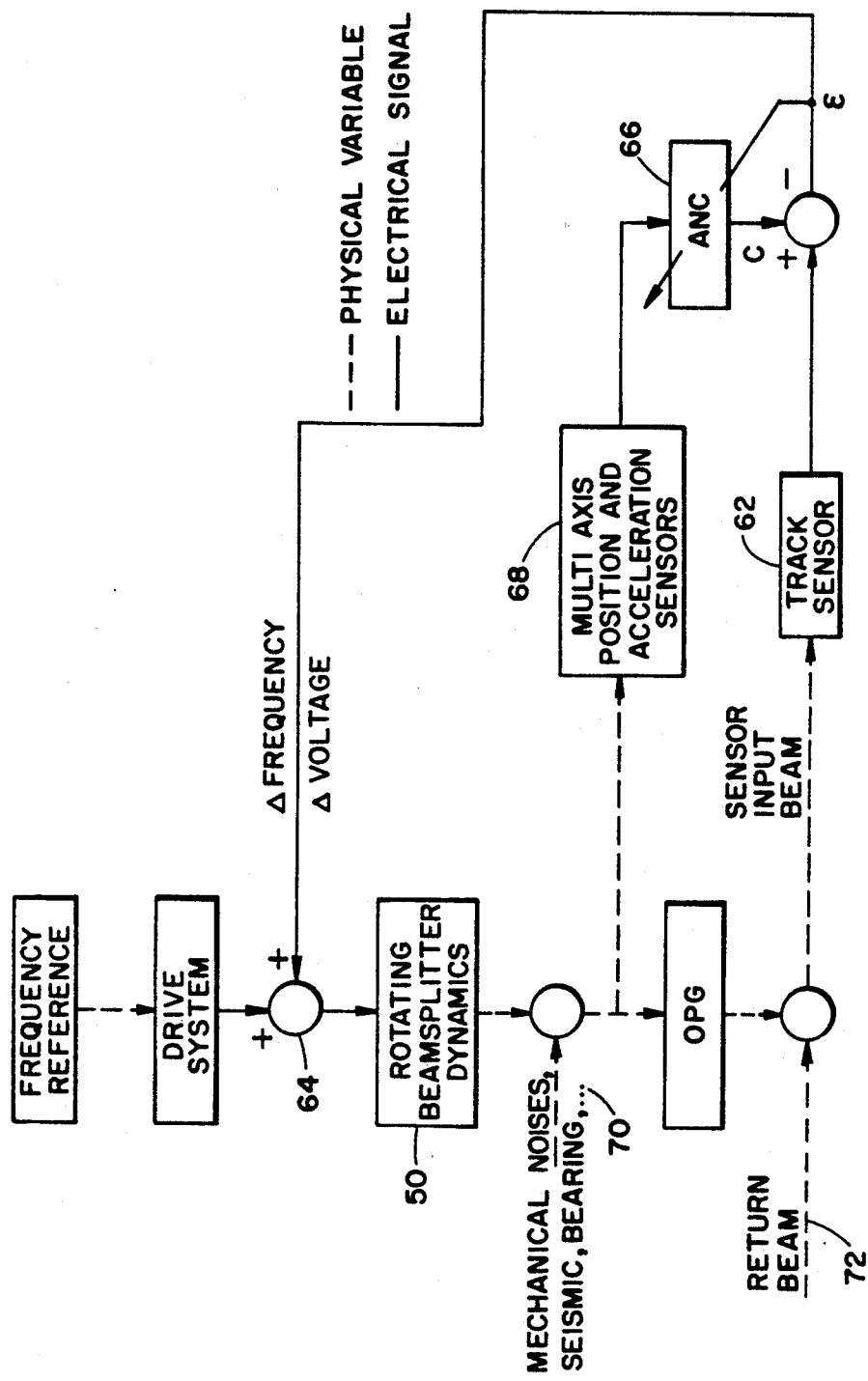
FIG. 11, is a block diagram of the closed loop optical system of FIG. 10 showing the connectivity of an ANC system thereto.

Referring now to FIG. 11 there is shown in block diagram form an ANC system coupled to the beamsplitter 50 drive system for cancelling these other motions other than the pure rotational motion about the axis 64. As can be seen, the rotating beamsplitter is driven by a frequency reference and a drive system and has at an input thereof a summing junction 64 wherein the output of the drive system is modified in order to correct for motions of the beamsplitter other than the desired motion. These other signals inputted at this point are a delta frequency and a delta voltage term which are, in accordance with the invention, derived by an ANC system 66.

As illustrated in FIG. 11, the ANC system 66 measures the translational and angular position of the beam splitter 50 by means of a plurality of multiaxis position and acceleration sensors 68 which may be mechanically coupled to the rotating beamsplitter mechanism. These multiaxis sensors 68 are operable for detecting and measuring disturbances in the rotating beamsplitter 50 resulting from a plurality of mechanical noise sources such as seismic noise sources, bearing noise sources and other similar mechanical noise sources. These noise sources are shown collectively at the block 70. The effect of these noise sources on the beamsplitter 50 is to cause a shift in the return beam 72, which shift is detected by track sensor 62.

In accordance with the foregoing description and derivation, after measuring the translational and angular position of the beamsplitter 50 the ANC 66 removes, by cancellation, any components of the track sensor 62 output which are correlated to the measured motions of the beamsplitter 50. This cancellation signal may be expressed as the delta frequency and delta voltage signals which are input to the closed loop system at the point 64 after the output of the drive system and before the input to the rotating beamsplitter 50.

In such a system as illustrated in FIGS. 10 and 11 it has been found that over a frequency range of interest that an improvement in the system rejection of the tracking error introduced by the mechanical noise source 70 has been improved by ANC compensation by a factor of 20 to 45 db over an uncompensated system.

Figure 12:
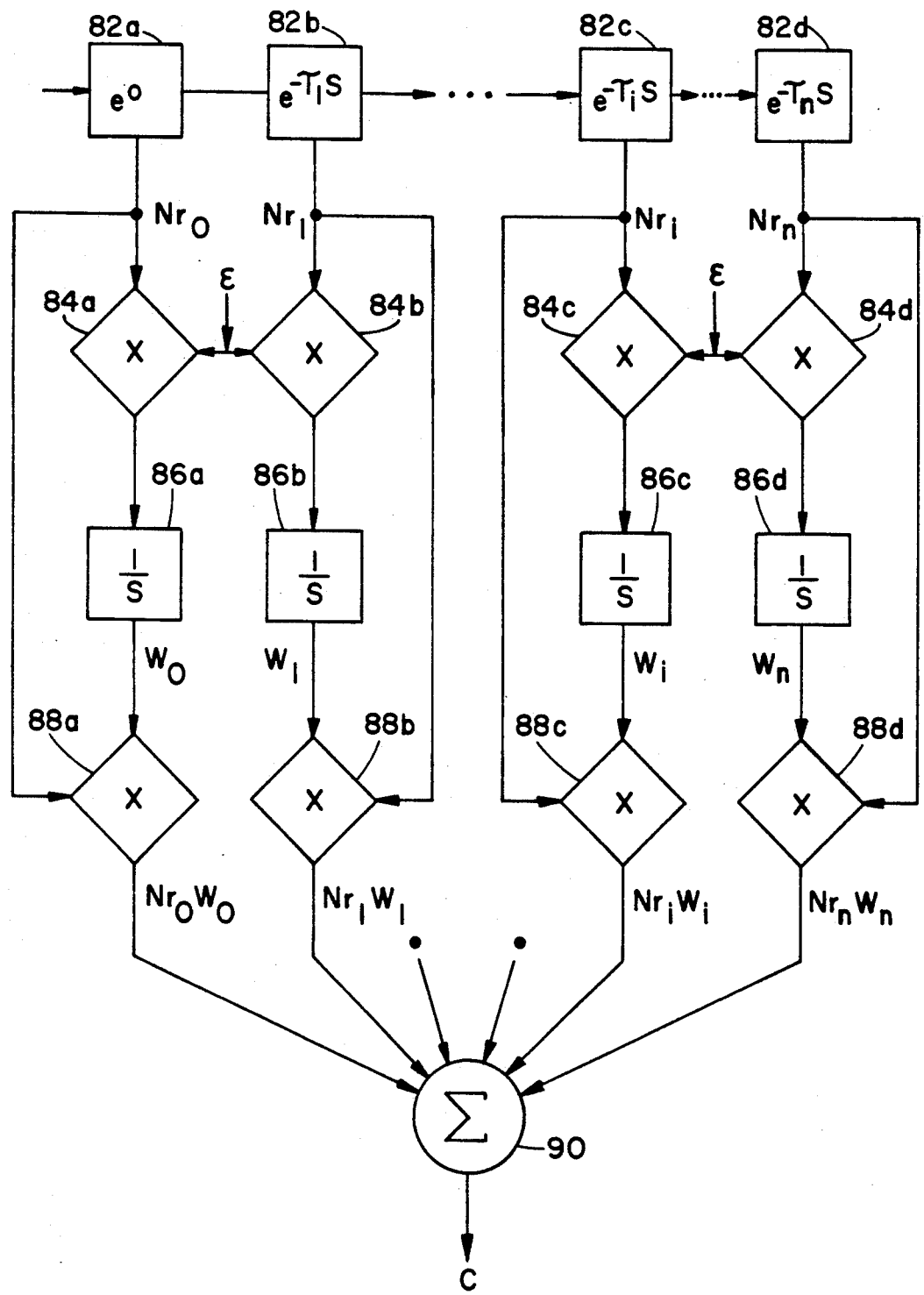
FIG. 12 is a block diagram of analog circuitry operable for generating the noise cancellation signal C.

Referring now to FIG. 12 there is shown in block diagram form analog circuitry operable for generating the cancellation signal C. As can be seen, the output Nr of the noise source measurement device is provided to a tapped delay line means, such as that shown in FIG. 3. The TDL comprises a plurality of delay elements 82 which are operable for delaying the Nr signal. Each of the delay elements 82 may comprise a surface acoustic wave device or some other device suitable for introducing a delay into the Nr signal. The output of ($Nr_0$ to $Nr_n$) each delay element 82 is provided to a first multiplier 84 operable for multiplying the delayed noise vector by the error signal $\epsilon$. The output of each of these multipliers 84 is thereafter provided to a divider 86 which divides this product by the signal S to generate the weighting gradients $W_0$ through $W_n$. Each of the weight gradients so generated is thereafter multiplied by its respective noise vector by a second multiplier 88 to produce a product which is expressive of the measured noise and the weight gradient. A summation circuit 90 combines each of these product terms to provide the cancellation signal C. As can be appreciated, the particular nature of these various multiplier, divider and summation networks is application specific and may be embodied by a variety of known circuit means.

Referring now to FIG. 13 there is shown one possible digital implementation of the adaptive noise cancellation system 100 of the invention wherein it can be seen that the Nr and the ε signal are each provided to an antialiasing filter 102 abd 104, respectively, each of which has an output coupled to an analog-to-digital (A/D) convertor 106 and 108, respectively. The outputs of A/D convertors 106 and 108 are coupled to a central processing unit (CPU) 110 which may be a microprocessor, a microcomputer or any digital data processing device operable for implementing the aforedescribed mathematical equations in order to calculate the required magnitude of the cancellation signal C and the compensation N. In order that the calculated cancellation signal C may be injected back into the control loop, CPU 110 is further coupled to a digital-to-analog (DA) convertor 112 which is operable for producing a desired analog voltage expressive of the cancellation signal C. The output of D/A convertor 112 may be provided to a smoothing filter 114 before being injected into the control loop.

Based upon the foregoing description of the invention it can be seen that illustrative embodiments of the invention have been disclosed and that modification of these embodiments may occur to those skilled in the art. Therefore, these illustrative embodiments are in no way meant or intended to limit the scope of the invention to these embodiments. The scope of the invention is instead meant to be limited only as defined by the appended claims.

What is claimed is:

1. An adaptive noise cancellation system for a closed-loop control system, the control system being operable for propagating a control signal therethrough, said adaptive noise cancellation system comprising:
   means for determining the characteristics of a noise reference signal, the noise reference signal being indicative of the characteristics of a noise signal associated with a closed loop control signal;
   means for correlating the noise reference signal to the noise signal, said correlating means having an input operatively coupled to a first predetermined point within the loop for determining the characteristics of the noise signal and a loop control signal;
   means for generating a noise cancellation signal having characteristics operable for substantially cancelling those characteristics of the noise signal which correlate with the noise reference signal, said generating means further comprising means for injecting said noise cancellation signal into the loop at a second predetermined point within the loop whereby the characteristics of the noise signal which correlate with the noise reference signal are substantially cancelled; and
   means for compensating for an effect of a feedback path of said control system upon the adaptive noise cancellation system.

2. An adaptive noise cancellation system as defined in claim 1 wherein said control loop comprises a control means having an output signal coupled to an actuator means for causing said actuator means to actuate a mechanism for movement in response to said output signal, said control means further having an input coupled to a feedback means coupled to said mechanism for providing said control means with a feedback signal expressive of the actuation of said mechanism and wherein the characteristics of said noise signal are a function at least of the actuation of said mechanism.

3. An adaptive noise cancellation system as defined in claim 2 wherein said first predetermined point is a point between said control means and said actuator means and wherein said second predetermined point is a point between said first predetermined point and said actuator means.

4. An adaptive noise cancellation system as defined in claim 2 wherein said second predetermined point is a point between said control means and said actuator means and wherein said first predetermined point is a point between said second predetermined point and said actuator means.

5. An adaptive noise cancellation system as defined in claim 2 wherein said means for correlating comprises a delay line means having a plurality of taps each of which is operable for outputting a time delayed noise reference signal, the time delay associated with each of said taps being in a range of substantially zero delay to some predetermined maximum delay.

6. An adaptive noise cancellation signal as defined in claim 5 wherein said correlating means further comprises first means operable for multiplying each of said time delayed noise reference signals by a loop error signal expressive at least of said control signal to generate a weighting gradient function associated with each of said time delayed noise reference signals, said correlating means further comprising second means operable for multiplying each of said weighting gradient functions by the associated time delayed noise reference signal, said correlating means further comprising means for summing together the plurality of products produced by said second multiplying means whereby said noise cancellation signal is generated.

7. An adaptive noise cancellation system as defined in claim 3 wherein said control signal includes an error signal and wherein said
   means for compensating compensates the error signal of said noise cancellation system such that a response of said closed loop control system to said noise signal is reduced, said means for compensating being operable for compensating the error signal of said noise cancellation system by an amount substantially equal to the inverse of an error rejection response of said closed loop control system.

8. An adaptive noise cancellation system as defined in claim 4 wherein said control signal includes an error signal and wherein said
   means for compensating compensates the error signal of said noise cancellation system such that a rejection of said noise signal by said closed loop control system is enhanced, said means for compensating being operable for compensating the error signal of said noise cancellation system by an amount substantially equal to the inverse of a closed loop response of said closed loop control system.

9. In a closed loop control system, a method of generating a compensated error signal ε with an adaptive noise cancellation system, the control system having a control signal S and a noise signal Np associated with S, comprising the steps of:
   coupling an adaptive noise cancellation system in parallel with at least a portion of a closed loop control system;
   measuring a noise reference signal Nr;
   generating a plurality of time delayed Nr signals, $Nr_o$ to $Nr_n$, where $Nr_o$ has substantially zero time delay and $Nr_n$ has a predetermined maximum time delay;
   multiplying each of the $Nr_o$ to $Nr_n$ signals by a weighting gradient function W wherein [W = −2 μ Nr ε dt]

$$W = \int_0^t 2\mu Nr\epsilon dt$$

where t is time and $\mu$ is an arbitrary constant of proportionality;

summing each of the products produced by the step of multiplying to calculate a noise cancellation signal C expressed as $$C = \sum_{i=o}^{i=n} W_i Nr_i;$$

injecting C into the closed loop control system such that the compensated error signal $\epsilon$ is generated in accordance with the equation $\epsilon = S + (Np - C);$ and compensating the error signal $\epsilon$ with a compensation transfer function N wherein N has a value determined to be operable for substantially compensating for the effect of a feedback path of the control system upon the adaptive noise cancellation system.

10. A method as defined in claim 9 wherein N has a value substantially equal to the inverse of an error rejection response of the closed loop control system.

11. A method as defined in claim 9 wherein N has a value substantially equal to the inverse of a closed loop response of the closed loop control system.

12. In a closed loop control system, a method of generating a compensated error signal $\epsilon$ with an adaptive noise cancellation system, the control system having a control signal S and a noise signal Np associated with S, comprising the steps of:

coupling an adaptive noise cancellation system in parallel with at least a portion of a closed loop control system;

measuring a noise reference signal Nr;

generating a plurality of time delayed Nr signals, $Nr_o$ to $Nr_n$, where $Nr_o$ has substantially zero time delay and $Nr_n$ has a predetermined maximum time delay;

multiplying each of the $Nr_o$ to $Nr_n$ signals by a weighting gradient function W wherein $W = \int_o^t 2\mu Nr \epsilon \, dt$ where t is time and $\mu$ is an arbitrary constant of proportionality;

summing each of the products produced by the step of multiplying to calculate a noise cancellation signal C expressed as $$C = \sum_{i=o}^{i=n} W_i Nr_i;$$

injecting C into the closed loop control system such that the compensated error signal $\epsilon$ is generated in accordance with the equation $\epsilon = S + (Np - C);$ and compensating the error signal $\epsilon$ with a compensation transfer function N wherein N has a value determined to be operable for substantially compensating for the effect of a feedback path of the control system upon the adaptive noise cancellation system;

wherein N is substantially equal to $$\frac{(1 + G_1 G_2 G_3 G_4 G_5)}{1} \times \frac{G_6}{G_4} \times \frac{1}{G_5}$$

where $G_1$ is related to an actuator dynamic of the closed loop;

$G_2$ is related to a mechanism dynamic of the closed loop;

$G_3$ is related to a coupling gain of the closed loop;

$G_4$ is related to a sensor gain of the closed loop;

$G_5$ is related to a compensation network of the closed loop; and $G_6$ is related to a sensing dynamic of a noise reference measuring device.

13. A method of providing a compensated closed loop error signal $\epsilon$ comprising the steps of:

generating a closed loop driving signal S having characteristics operable to cause an actuator to drive a mechanism in a predetermined manner;

determining the characteristics of a noise signal Np associated with S;

generating an adaptive noise cancellation signal C having characteristics which substantially cancel the noise signal Np;

injecting the adaptive noise cancellation signal C into the closed loop to generate a closed loop error signal $\epsilon$; and compensating $\epsilon$ by an amount substantially equal to the negative inverse of a transfer function expressive of the relationship $\epsilon/C$.

14. A method as defined in claim 13 wherein the step of compensating further comprises a step of feeding back the closed loop error signal $\epsilon$ to the adaptive noise cancellation system.

15. A method as defined in claim 13 wherein the step of determining comprises the steps of:

measuring a noise reference signal Nr having characteristics indicative of the characteristics of Np; and successively delaying the Nr signal to obtain a plurality of delayed Nr signals.

16. A method as defined in claim 15 wherein the step of generating a noise cancellation signal comprises the steps of:

deriving a weighting function W for each of said plurality of delayed Nr signals;

multiplying each of the weighting functions by the respective Nr signal to obtain a product thereof; and summing each of said products together to generate the noise cancellation signal C.

17. A closed loop control system having a compensated closed loop error signal $\epsilon$, comprising:

means for generating a closed loop driving signal S;

means for determining the characteristics of a noise signal Np associated with S;

means for generating an adaptive noise cancellation signal C having characteristics which substantially cancel the noise signal Np;

means for injecting the adaptive noise cancellation signal C into the closed loop to generate a closed loop error signal $\epsilon$; and means for compensating $\epsilon$ by an amount substantially equal to the negative inverse of a transfer function expressive of the relationship $\epsilon/C$.

18. A system as set forth in claim 17 wherein said determining means comprises:
- means for measuring a noise reference signal Nr having characteristics indicative of the characteristics of Np; and
- means for successively delaying the Nr signal to obtain a plurality of delayed Nr signals.

19. A system as set forth in claim 18 wherein said generating means comprises:
- means for deriving a weighting function W for each of the plurality of delayed Nr signals;
- means for multiplying each of the weighting functions by the respective Nr signal to obtain a product thereof; and
- means for summing each of the products together to generate the noise cancellation signal C.

* * * * *